(12) United States Patent
Sankman et al.

(10) Patent No.: US 11,521,923 B2
(45) Date of Patent: Dec. 6, 2022

(54) INTEGRATED CIRCUIT PACKAGE SUPPORTS

(71) Applicant: Intel Corporation, Santa Clara, CA (US)

(72) Inventors: Robert L. Sankman, Phoenix, AZ (US); Kevin McCarthy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1002 days.

(21) Appl. No.: 15/988,613

(22) Filed: May 24, 2018

(65) Prior Publication Data

US 2019/0363046 A1 Nov. 28, 2019

(51) Int. Cl.
*H01L 23/498* (2006.01)
*H01L 21/48* (2006.01)

(52) U.S. Cl.
CPC ...... *H01L 23/49838* (2013.01); *H01L 21/481* (2013.01); *H01L 21/4846* (2013.01); *H01L 23/49894* (2013.01)

(58) Field of Classification Search
CPC ....... H01L 23/48; H01L 23/52; H01L 23/481; H01L 23/498; H01L 21/30; H01L 21/46; H01L 21/48; H01L 21/481; H01L 21/4846; H01L 21/486; H01L 21/768; H01L 29/40; H01L 29/41; H05K 1/11; H05K 1/14; H05K 1/18
USPC ...................... 361/760–767, 790–795, 803; 174/258–268
See application file for complete search history.

(56) References Cited

U.S. PATENT DOCUMENTS

| | | | | |
|---|---|---|---|---|
| 6,841,883 B1* | 1/2005 | Farnworth | ............ | H01L 21/561 257/777 |
| 7,088,003 B2* | 8/2006 | Gates | ................ | H01L 23/53295 174/257 |
| 7,410,884 B2* | 8/2008 | Ramanathan | ........... | H01L 24/11 438/455 |
| 7,928,534 B2* | 4/2011 | Hsu | ......................... | H01L 24/12 257/621 |
| 8,791,549 B2* | 7/2014 | Chen | ................ | H01L 21/76877 257/621 |
| 8,872,253 B2* | 10/2014 | Lee | ................... | H01L 27/11582 257/314 |
| 9,603,249 B2* | 3/2017 | Rathburn | ............. | H05K 3/4688 |
| 9,859,159 B2* | 1/2018 | Hu | ..................... | H01L 21/76879 |
| 2002/0027022 A1* | 3/2002 | Moriizumi | ........ | H01L 23/49827 174/265 |
| 2002/0084513 A1* | 7/2002 | Siniaguine | .......... | H01L 25/0657 257/E29.022 |
| 2002/0105087 A1* | 8/2002 | Forbes | .................. | H01L 23/147 257/774 |
| 2008/0211106 A1* | 9/2008 | Chang | ............... | H01L 21/76831 257/E23.141 |

(Continued)

*Primary Examiner* — Tuan T Dinh
(74) *Attorney, Agent, or Firm* — Akona IP PC

(57) ABSTRACT

Disclosed herein are integrated circuit (IC) package supports and related apparatuses and methods. For example, in some embodiments, an IC package support may include a layer of dielectric material; a conductive pad at least partially on a top surface of the layer of dielectric material; and a layer of material on side surfaces of the conductive pad, wherein the layer of material does not extend onto the top surface of the layer of dielectric material. Other embodiments are also disclosed.

16 Claims, 8 Drawing Sheets

(56) References Cited

U.S. PATENT DOCUMENTS

| | | | |
|---|---|---|---|
| 2010/0188795 A1* | 7/2010 | Kim | H01L 27/10852 |
| | | | 361/272 |
| 2011/0048788 A1* | 3/2011 | Wang | H01L 23/481 |
| | | | 174/262 |
| 2011/0186990 A1* | 8/2011 | Mawatari | H01L 24/16 |
| | | | 257/737 |
| 2011/0254160 A1* | 10/2011 | Tsai | H01L 21/76898 |
| | | | 257/738 |
| 2012/0326296 A1* | 12/2012 | Choi | H01L 24/13 |
| | | | 257/737 |
| 2013/0168132 A1* | 7/2013 | Lee | H05K 3/00 |
| | | | 174/250 |
| 2013/0270715 A1* | 10/2013 | Malatkar | H01L 24/19 |
| | | | 257/774 |
| 2014/0117546 A1* | 5/2014 | Liu | H01L 21/76834 |
| | | | 257/751 |
| 2020/0120794 A1* | 4/2020 | Somada | H01L 24/19 |

* cited by examiner

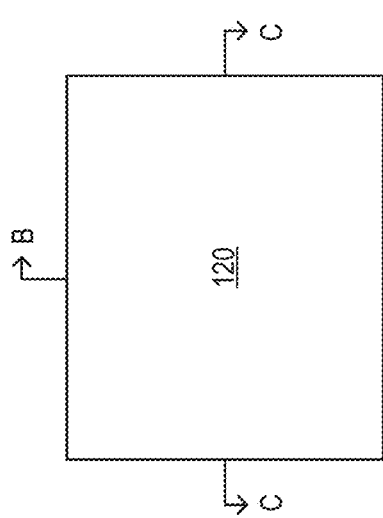
FIG. 4A
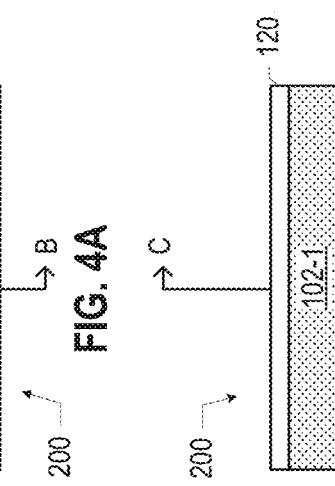
FIG. 4B
FIG. 4C
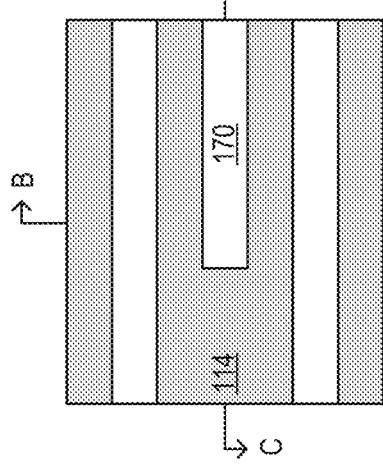
FIG. 5A
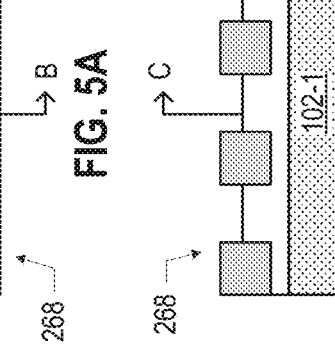
FIG. 5B
FIG. 5C
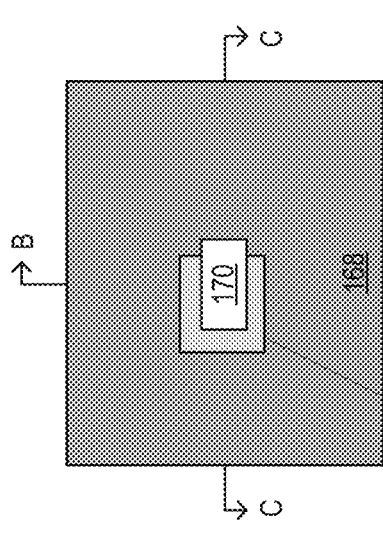
FIG. 6A
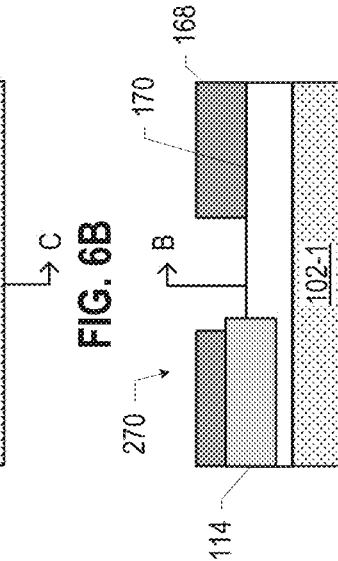
FIG. 6B
FIG. 6C

INTEGRATED CIRCUIT PACKAGE SUPPORTS

BACKGROUND

Conventional integrated circuit (IC) package substrates and interposers may be used to spread electrical pathways from a narrower pitch to a wider pitch, among other purposes. Such electrical pathways typically include a conductive material insulated from other electrical pathways by one or more dielectric materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 4A-4C, 5A-5C, and 6A-6C illustrate stages in an example process of manufacturing an IC package support, in accordance with various embodiments.

DETAILED DESCRIPTION

Figure 1:
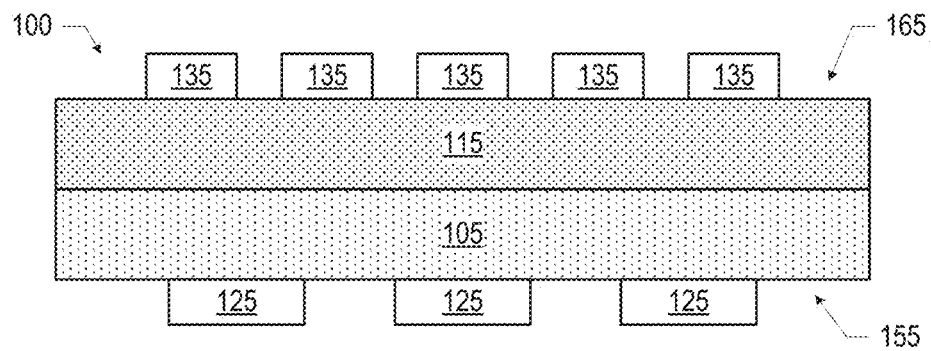
FIG. 1 is a cross-sectional side view of an integrated circuit (IC) package support, in accordance with various embodiments.

Disclosed herein are integrated circuit (IC) package supports and related apparatuses and methods. For example, in some embodiments, an IC package support may include a layer of dielectric material; a conductive pad at least partially on a top surface of the layer of dielectric material; and a layer of material on side surfaces of the conductive pad, wherein the layer of material does not extend onto the top surface of the layer of dielectric material. Other embodiments are also disclosed.

In conventional semi-additive processes that may be used in IC packaging fabrication, a thin seed layer (e.g., of copper) may be applied to carry a plating current during electroplating around a patterned photoresist. After electroplating is completed, and the patterned photoresist is removed, the seed layer is typically etched away. However, this etch not only removes the seed layer, but may also remove material from the side surfaces of the plated features, thinning those features. When the features themselves are relatively small (e.g., less than 5 microns), the amount of thinning that occurs as a result of the seed etch may substantially compromise the desired features and/or may introduce significant variability into the size of features across a layer.

Various ones of the embodiments disclosed herein may reduce the impact of seed etch on fine electroplated features, preserving the desired dimensions of these features and reducing variability.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 2" may be used to refer to the collection of drawings of FIGS. 2A-2M, the phrase "FIG. 3" may be used to refer to the collection of drawings of FIGS. 3A-3F, etc.

FIG. 1 is a cross-sectional side view of an IC package support 100, in accordance with various embodiments. The IC package support 100 may be included in an IC package in any of a number of ways; for example, the IC package support 100 may be a package substrate or an interposer (e.g., as discussed below with reference to FIG. 9).

The IC package support 100 may include conductive pathways between a first face 155 and a second face 165, conductive pathways between different locations on the first face 155, and/or conductive pathways between different locations on the second face 165. The IC package support 100 may include a coarse line space portion 105 and a fine line space portion 115; in some embodiments, a transition portion (not shown) may be present between the coarse line space portion 105 and the fine line space portion 115. As used herein, "coarse" and "fine" are relative terms, denoting that the minimum spacing between features (e.g., conductive lines, referred to herein as "lines") in the coarse line space portion 105 is greater than the minimum spacing between features in the fine line space portion 115. In some embodiments, the minimum size of features in the coarse line space portion 105 may be greater than the minimum size of features the fine line space portion 115. For example, the minimum width of a line and/or the minimum diameter of a conductive via (referred to herein as a "via") in the coarse line space portion 105 may be greater than the minimum width of a line and/or the minimum diameter of a via, respectively, in the fine line space portion 115. In some embodiments, the minimum spacing between adjacent lines in the coarse line space portion 105 may be greater than 5 microns (e.g., 10 microns), while the minimum spacing between adjacent lines in the fine line space portion 115 may be less than 5 microns (e.g., 2 microns). In some embodiments, the minimum width of a line in the coarse line space portion 105 may be greater than 5 microns (e.g., 10 microns), while the minimum width of a line in the fine line space portion 115 may be less than 5 microns (e.g., 2 microns). In some embodiments, the minimum diameter of the via in the coarse line space portion 105 may be greater than 20 microns (e.g., greater than 25 microns, or greater than 40 microns), while the minimum diameter of a via in the fine line space portion 115 may be less than 20 microns (e.g., less than 10 microns, or between 2 microns and 15 microns). When present, conductive features (such as lines and vias) in a transition portion may have dimensions suitable to electrically interconnect conductive features in the coarse line space portion 105 with conductive features and the fine line space portion 115.

The IC package support 100 may include conductive contacts 125 at the first face 155 (proximate to the coarse line space portion 105), and conductive contacts 135 at the second face 165 (proximate to the fine line space portion 115). As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In some embodiments, the width of the conductive contacts 125 may be greater than the width of the conductive contacts 135; in some embodiments, the minimum spacing between adjacent conductive contacts 125 may be greater than the minimum spacing between adjacent ones of the conductive contacts 135. In some embodiments, during use, one or more dies or other electronic components may be coupled to the conductive contacts 135, and the conductive contacts 125 may be coupled to a package substrate, circuit board, or other component (e.g., as discussed below with reference to FIG. 9). In some embodiments, a solder resist (not shown) may be disposed around the conductive contacts 125.

A number of examples of IC package supports 100 are disclosed herein, as are various manufacturing techniques for fabricating such IC package supports 100. A number of elements of various ones of the accompanying figures are shared with others of the accompanying figures; for ease of discussion, a description of these elements is not repeated, and these elements may take the form of any of the embodiments disclosed herein.

FIGS. 2A-2M illustrate stages in an example process of manufacturing an example IC package support 100, in accordance with various embodiments. Although the operations of FIG. 2 (and others of the accompanying figures) may be illustrated with reference to particular embodiments of the IC package supports 100 disclosed herein, the method may be used to form any suitable IC package supports 100. Operations are illustrated once each and in a particular order in FIG. 2 (and others of the accompanying figures), but the operations may be reordered and/or repeated as desired (e.g., with different operations performed in parallel when manufacturing multiple IC package supports 100 simultaneously).

Figure 2A:
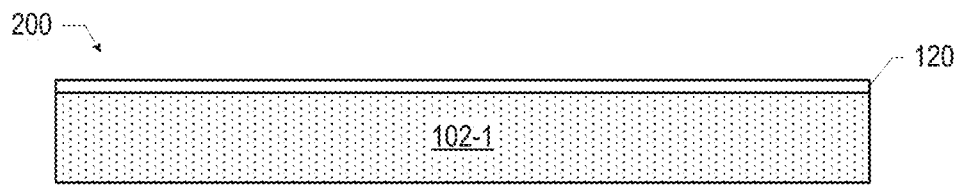
FIGS. 2A-2M illustrate stages in an example process of manufacturing an IC package support, in accordance with various embodiments.

FIG. 2A illustrates an assembly 200 including a layer of dielectric material 102-1 and a seed layer 120 of conductive material on a top surface of the layer of dielectric material 102-1. In some embodiments, the layer of dielectric material 102-1 may have conductive features (e.g., vias, lines, or pads) therein; such features are not shown in the accompanying figures for ease of illustration. In some embodiments, the layer of dielectric material 102-1 may be part of the coarse line space portion 105, while in other embodiments, the layer of dielectric material 102-1 may be part of the fine line space portion 115. The assembly 200 may include additional layers and features that are not shown. For example, in some embodiments, the assembly 200 may include a core on which multiple organic, polymer-based dielectric layers (e.g., buildup layers) are formed, and through which conductive pathways extend. In some embodiments, the conductive contacts 125 may be formed on the first face 155 of the coarse line space portion 105 prior to the operations discussed with reference to FIG. 2 (and others of the accompanying drawings); in other embodiments, the conductive contacts 125 may be formed after the operations discussed with reference to FIG. 2 (and others of the accompanying drawings). For example, the coarse line space portion 105 may be fabricated (e.g., using a cored substrate process flow), and then the face of the coarse line space portion 105 on which the fine line space portion 115 will be disposed may be covered with a first temporary protective film (e.g., by lamination) while solder resist and surface finish operations are performed on the first face 155 to form the conductive contacts 125; after the solder resist and surface finish operations are performed on the first face 155, the first face 155 may be covered with a second temporary protective film, the first temporary film may be removed, and the operations discussed below may be performed on the newly exposed face of the coarse line space portion 105 (and followed by, for example, the formation of the conductive contacts 135).

The dielectric material 102-1 of the assembly 200 may be an organic, polymer-based dielectric material, such as a buildup film. In some embodiments, the dielectric material 102-1 may be an epoxy material having filler particles therein. For example, the filler particles may be silica, and may have a substantially spherical shape. In some embodiments, the layer of dielectric material 102-1 may be photoimageable, while in other embodiments, the layer of dielectric material 102-1 may not be photoimageable. As used herein, a "photoimageable material" refers to a material that includes photoactive components that cross-link or render the material soluble when exposed to appropriate illumination. The seed layer 120 may include copper and/or other metals. In some embodiments, the seed layer 120 may be formed by sputtering or by electroless deposition. An adhesion promoter material (not shown) may be deposited on the layer of dielectric material 102-1 before forming the seed layer 120; in some embodiments, that adhesion promoter material may include titanium. In some embodiments, the seed layer 120 may have a thickness between 200 nanometers and 1 micron.

Figure 2B:
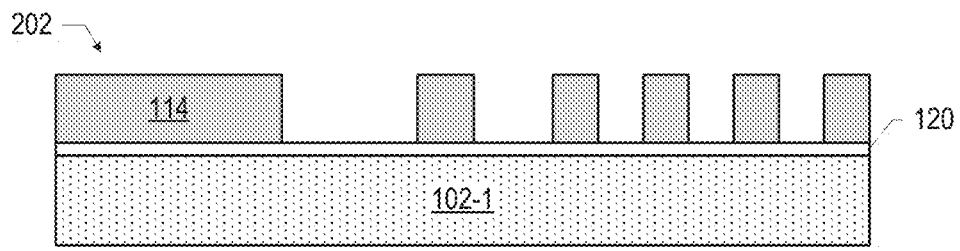

FIG. 2B illustrates an assembly 202 subsequent to depositing and patterning a photoresist 114 on the seed layer 120 of the assembly 200 (FIG. 2A). The photoresist 114 may be deposited using any suitable technique (e.g., spin-on deposition or lamination). The patterning of the photoresist 114 may expose one or more areas on the seed layer 120, while other portions of the seed layer 120 may be covered by photoresist 114. The photoresist 114 may be patterned using any suitable lithographic technique (e.g., exposing the photoresist 114 with a mask to change the solubility of different portions of the photoresist 114 and then etching away the more soluble portions, as known in the art).

Figure 2C:
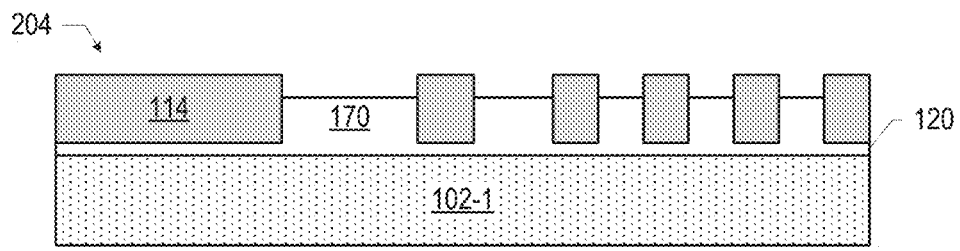

FIG. 2C illustrates an assembly 204 subsequent to depositing conductive material 170 (e.g., metal) on the seed layer 120 in the openings of the photoresist 114 of the assembly 202 (FIG. 2B). The conductive material 170 (e.g., copper) may be formed by electroplating on the seed layer 120. In some embodiments, the top surface of the conductive material 170 may be recessed below the top surface of the photoresist 114, as shown in FIG. 2C, while in other embodiments, the top surface of the conductive material 170 may be planar with the top surface of the photoresist 114 (e.g., as a result of a planarization operation).

Figure 2D:
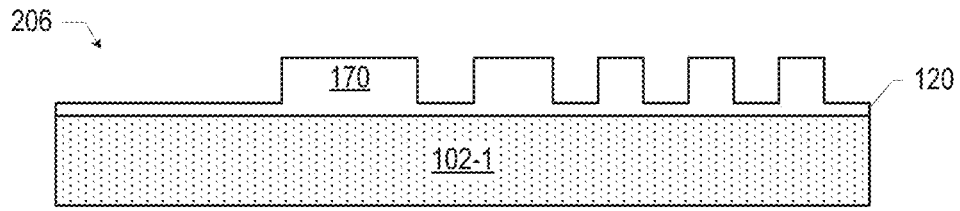

FIG. 2D illustrates an assembly 206 subsequent to stripping the photoresist 114 from the assembly 204 (FIG. 2C). Any suitable technique may be used to remove the photoresist 114 while preserving the seed layer 120 and the conductive material 170.

Figure 2E:
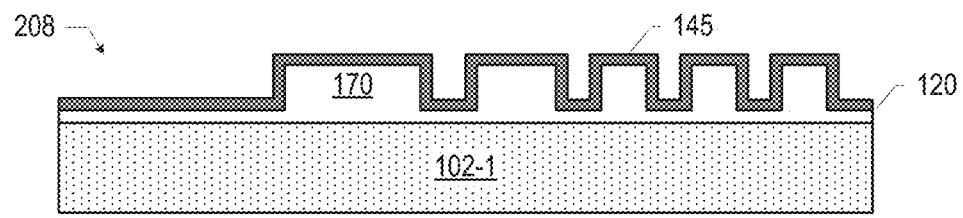

FIG. 2E illustrates an assembly 208 subsequent to forming a protective layer 145 on the seed layer 120 and conductive material 170 of the assembly 206 (FIG. 2D). The protective layer 145 may be conformal, and may be formed using any suitable technique (e.g., chemical vapor deposition (CVD)). As discussed further below, the protective layer 145 may serve to protect side surfaces of the conductive material 170 during removal of the seed layer 120, and thus the material composition of the protective layer 145 may be selected so as to provide this protective function during seed etch. In some embodiments, the protective layer 145 may include nitrogen; the inclusion of nitrogen in the protective layer 145 may aid in the adhesion of the protective layer 145 to the underlying conductive material 170/seed layer 120. For example, in some embodiments, the protective layer 145 may be silicon nitride. In some embodiments, the protective layer 145 may include a polymer or other inorganic material. For example, the protective layer 145 may include a CVD polymer film. The protective layer 145 may be formed to any suitable thickness. For example, in some embodiments, the thickness of the protective layer 145 may be between 200 nanometers and 400 nanometers.

Figure 2F:
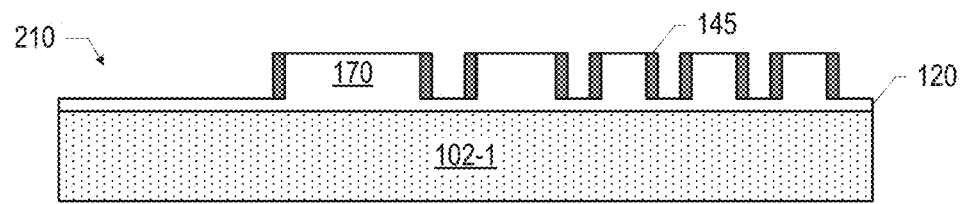

FIG. 2F illustrates an assembly 210 subsequent to performing a directional (or "anisotropic") etch of the protective layer 145 of the assembly 208 (FIG. 2E) "downward" to remove the portions of the protective layer 145 on "horizontal" surfaces of the assembly 208 while substantially preserving the portions of the protective layer 145 on "vertical" surfaces. After the directional etch, the protective layer 145 may not be present on the exposed seed layer 120, but may be present on the side surfaces of the conductive material 170, as shown in FIG. 2F.

Figure 2G:
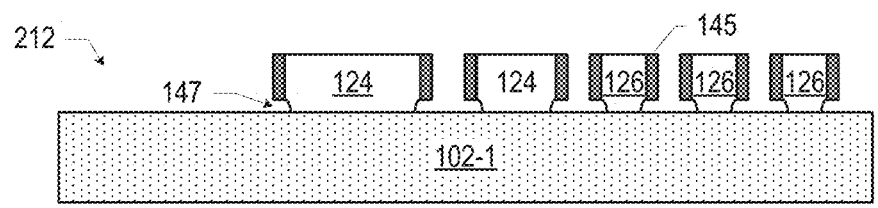

FIG. 2G illustrates an assembly 212 subsequent to performing a seed etch to remove the exposed seed layer 120 from the assembly 210 (FIG. 2F). The remaining conductive material may provide conductive pads (referred to herein as "pads") 124 and conductive lines (referred to herein as "lines") 126. The pads 124 and lines 126 may be at least partially (or entirely) on the planarized surface of the dielectric material 102-2. In some embodiments, the pads 124 and lines 126 may be part of the fine line space portion 115 of the IC package support 100. Although various structures may be referred to herein as "pads" or "lines," in some embodiments, pads (on which a via "lands," as discussed below) may be portions of lines, and lines may also serve as pads. Although a particular number and arrangement of vias 128, pads 124, and/or lines 126 is shown in various ones of the accompanying drawings, these arrangements are simply illustrative, and any IC package support 100 may include any suitable arrangement. The seed etch may remove some of the material at the exposed top surfaces of the conductive material 170, and may result in undercuts 147 of the conductive material 170 proximate to the layer of dielectric material 102-1. The height of the undercuts 147 may be approximately equal to the thickness of the seed layer 120 (e.g., between 200 nanometers and 1 micron), while the depth (or "width") of the undercuts 147 may depend on the timing and aggressiveness of the seed etch. In some embodiments, the depth of the undercuts 147 may be approximately equal to the difference between the thickness of the protective layer 145 and the thickness of the seed layer 120; for example, in embodiments in which the protective layer 145 has a thickness of 400 nanometers and the seed layer has a thickness of 600 nanometers, the depth of the undercuts 147 may be approximately 200 nanometers. During the seed etch, the protective layer 145 may prevent or mitigate the etching of the conductive material 170 from its side faces, substantially preserving the "width" of the pads 124/lines 126.

Figure 2H:
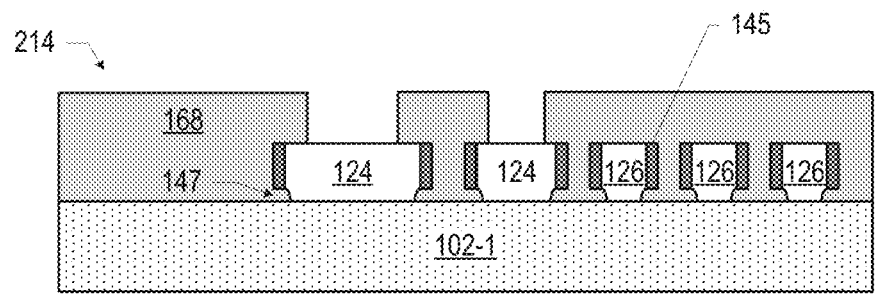

FIG. 2H illustrates an assembly 214 subsequent to depositing and patterning a photoresist 168 on the assembly 212 (FIG. 2G). The photoresist 168 may be patterned with openings to selectively expose the pads 124 of the assembly 212 in accordance with any techniques known in the art.

Figure 2I:
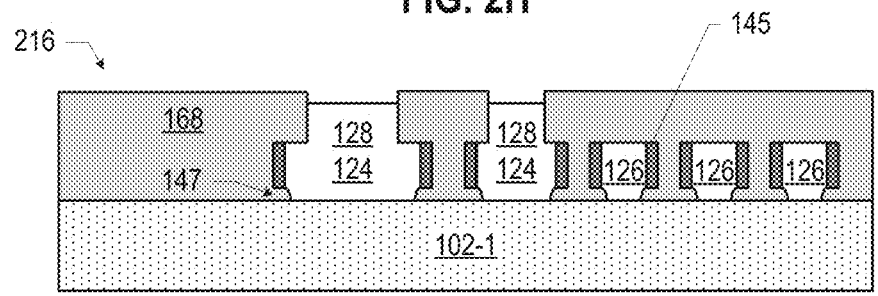

FIG. 2I illustrates an assembly 216 subsequent to depositing conductive material (e.g., metal) in the openings of the photoresist 168 of the assembly 214 (FIG. 2H) to form vias 128 in electrical contact with the pads 124. The vias 128 are shown in FIG. 2I as having side surfaces that do not taper towards the pads 124, but in some embodiments, the angle of this taper may be between 80 degrees and 90 degrees (the embodiment illustrated). For example, the angle of taper of the side surfaces of the vias 128 may be between 85 degrees and 90 degrees. Such angles of taper may be achievable by photolithography, and may distinguish the vias 128 from those formed by laser drilling (which may have angles of taper that are less than 80 degrees). In some embodiments, a via 128 may have a maximum diameter that is less than 20 microns (e.g., between 2 microns and 20 microns, between 2 microns and 15 microns, or between 2 microns and 10 microns).

Figure 2J:
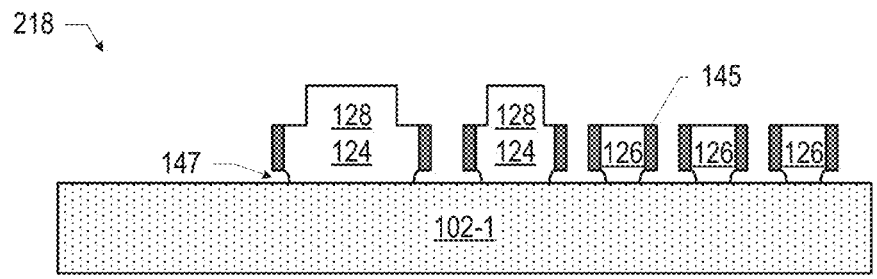

FIG. 2J illustrates an assembly 218 subsequent to stripping the photoresist 168 from the assembly 216 (FIG. 2I).

Figure 2K:
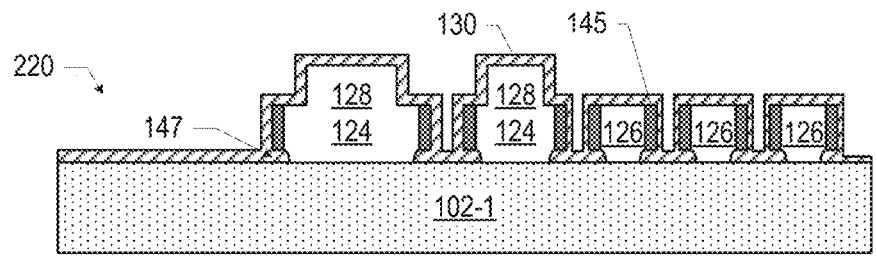

FIG. 2K illustrates an assembly 220 subsequent to forming a layer of adhesion promoter material 130 on the assembly 218 (FIG. 2J). The adhesion promoter material 130 may include silicon nitride, silicon oxide, silicon oxynitride, an organic adhesion promoter, or any other suitable material. In some embodiments, the adhesion promoter material 130 may be deposited by plasma enhanced CVD (PECVD). The layer of adhesion promoter material 130 may be present on side surfaces of the vias 128, and may extend onto the protective layer 145 and onto the layer of dielectric material 102-1, as shown. In some embodiments, no adhesion promoter material 130 may be used. Conventional adhesion promoter materials applied to facilitate the attachment of a dielectric material 102 on conductive structures, like the adhesion promoter material 130 and as discussed below with reference to FIG. 2L, are typically applied so as to only leave a molecular monolayer on surfaces of the conductive structure, and may not themselves provide the protective function of the protective layers 145 disclosed herein.

Figure 2L:
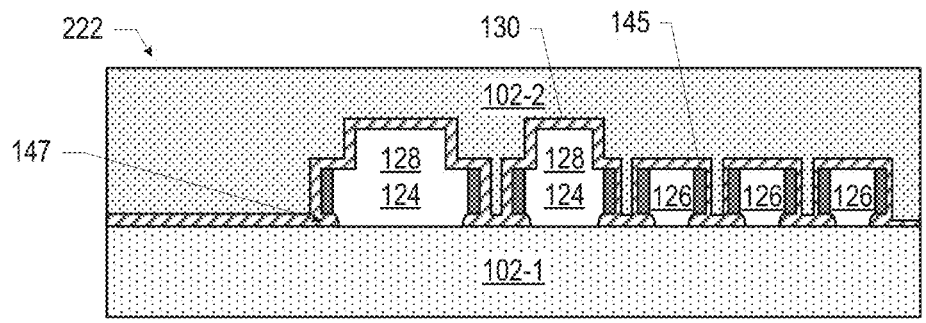

FIG. 2L illustrates an assembly 222 subsequent to forming a dielectric material 102-2 on the adhesive promoter material 130 of the assembly 220 (FIG. 2K). In some embodiments, the dielectric material 102-2 may be laminated onto the assembly 222. The dielectric material 102-2 may have a same material composition as the dielectric material 102-1, or may have a different material composition. For example, in some embodiments in which the dielectric material 102-1 has silica filler particles with a particular diameter (e.g., when the dielectric material 102-1 is part of the coarse line space portion 105), the dielectric material 102-2 may have silica filler particles with a smaller diameter. For example, the dielectric material 102-2 may have silica filler particles with a diameter that is less than 1 micron (e.g., between 100 nanometers and 500 nanometers).

Figure 2M:
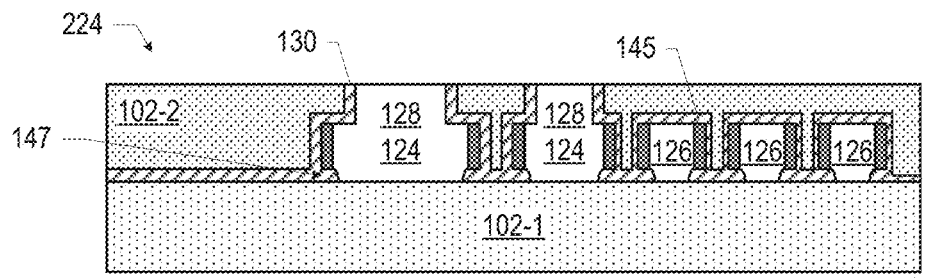

FIG. 2M illustrates an assembly 224 subsequent to removing the dielectric material 102-2 above the vias 128 of the assembly 222 (FIG. 2L), and also to removing the adhesion promoter material 130 from the top faces of the vias 128. The dielectric material 102-2 and adhesion promoter material 130 may be removed using plasma etching or mechanical grinding or polishing, for example. Adhesion promoter material 130 may remain on the side surfaces of the vias 128, the side faces of the pads 124 and lines 126, and on portions of the top surface of the dielectric material 102-2, as shown. The material of the vias 128 may be exposed (or "revealed") in the assembly 224. The operations of FIGS. 2A-2M may be repeated as desired to form multiple layers of features in the IC package support 100. The resulting assembly may be further processed to form the conductive contacts 135, and any additional operations may also be performed.

In some embodiments, the dielectric material 102-2 may be deposited before the vias 128 are formed. In such embodiments, the formation of the vias 128 may include laser drilling an opening in the dielectric material 102-2 or, when the dielectric material 102-2 is a photoimageable dielectric, patterning the dielectric material 102-2 with an opening in which a via 128 may be formed. For example, FIGS. 3A-3F illustrate various stages in an example process of manufacturing an IC package support 100 in which the dielectric material 102-2 is deposited before the vias 128 are formed. The operations of FIGS. 3A-3F may be performed instead of the operations of FIGS. 2H-2M, for example.

Figure 3A:
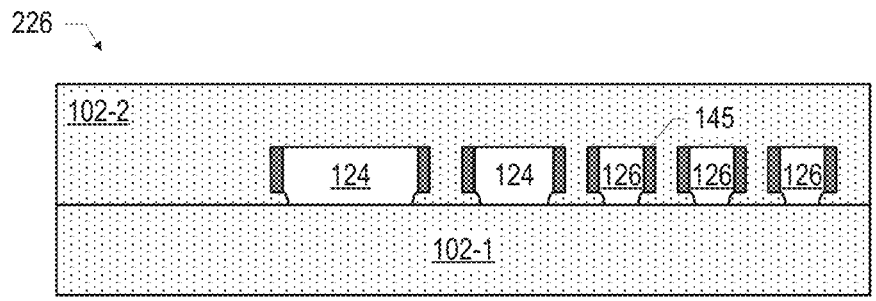
FIGS. 3A-3F illustrate stages in an example process of manufacturing an IC package support, in accordance with various embodiments.

FIG. 3A illustrates an assembly 226 subsequent to providing a dielectric material 102-2 on the assembly 212 (FIG. 2G). In some embodiments, the dielectric material 102-2 may be laminated onto the assembly 212. The dielectric material 102-2 may have a same material composition as the dielectric material 102-1, or may have a different material composition. In some embodiments, the dielectric material 102-2 may be non-photoimageable. In other embodiments, the dielectric material 102-2 may be photoimageable. In some embodiments, the top surface of the dielectric material 102-2 may be planarized (e.g., using a chemical mechanical planarization (CMP) technique). In the embodiment of FIG. 3A, the protective layer 145 may also serve to improve adhesion between the dielectric material 102-2 and the pads 124 relative to structures in which no protective layer 145 is present. Use of the protective layer techniques 145 discussed herein may thus obviate the use of a metal surface roughening treatment (e.g., an organic acid-type solution applied to a copper surface), which is conventionally used to roughen the surface of a metal before provision of a dielectric material over that metal to improve adhesion between the metal and the dielectric material. Such roughening treatments may result in an uneven metal surface that may negative impact high frequency performance; the use of the protective layer 145 techniques disclosed herein may thus reduce surface roughness of metal features and improve high frequency performance relative to conventional approaches.

Figure 3B:
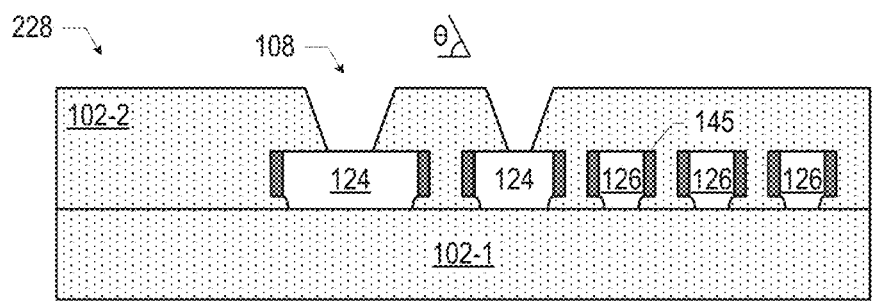

FIG. 3B illustrates an assembly 228 subsequent to forming openings 108 in the dielectric material 102-2 of the assembly 226 (FIG. 3A). Top surfaces of the pads 124 may be exposed at the bottom of the openings 108. In some embodiments in which the dielectric material 102-2 is non-photoimageable, the openings 108 may be formed by laser drilling. In some embodiments, openings 108 (and corresponding vias 128, discussed below) formed by laser drilling may have side surfaces that taper at an angle θ that is less than 85 degrees (e.g., less than 80 degrees, or between 70 degrees and 80 degrees). In some embodiments, an opening 108 (and corresponding via 128) may have a maximum diameter (referred to herein as a "diameter") that is greater than 20 microns; for example, a via formed by drilling with a carbon dioxide laser may have a diameter that is greater than 40 microns (e.g., between 40 microns and 50 microns), and a via formed by drilling with an ultraviolet laser may have a diameter that is greater than 20 microns (e.g., between 20 microns and 25 microns). In some embodiments in which the dielectric material 102-2 is photoimageable, the openings 108 may be formed by photolithographically patterning the dielectric material 102-2, in accordance with any suitable known technique.

Figure 3C:
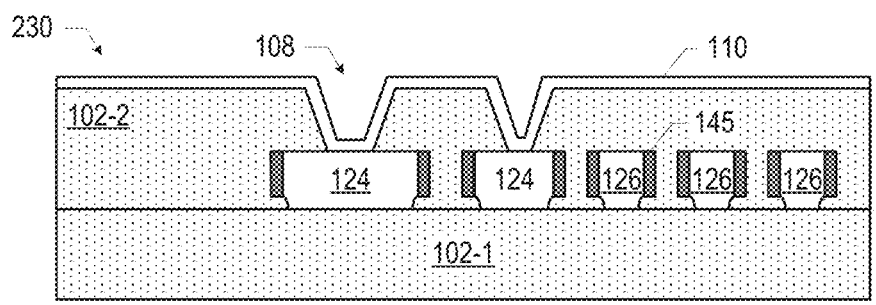

FIG. 3C illustrates an assembly 230 subsequent to performing a desmear operation (e.g., a plasma desmear) on the assembly 228 (FIG. 3B) and then forming a seed layer 110 of a conductive material (e.g., copper). In some embodiments, a layer of adhesion promoter material (not shown) may be formed after the desmear operation and before the formation of the seed layer 110. The adhesion promoter material may facilitate mechanical adhesion between the seed layer 110 and the dielectric material 102-2. In some embodiments, the adhesion promoter material may include titanium. The seed layer 110 may be formed by any suitable technique (e.g., sputtering or electroless deposition), and both the adhesion promoter material and the seed layer 110 may be substantially conformal.

Figure 3D:
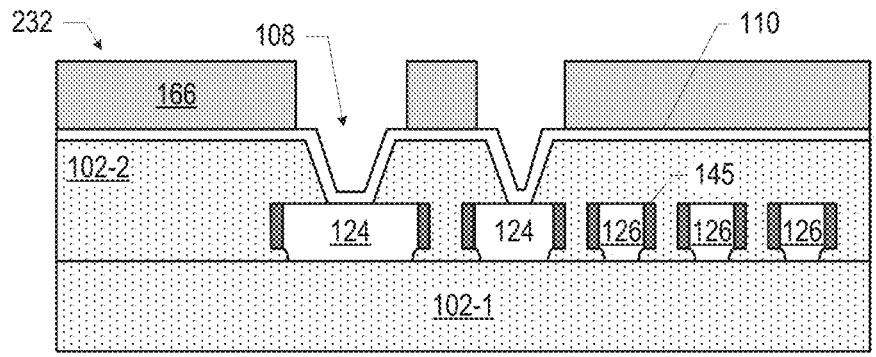

FIG. 3D illustrates an assembly 232 subsequent to depositing and patterning a photoresist 166 on the seed layer 110 of the assembly 230 (FIG. 3C). The photoresist 166 may be deposited using any suitable technique (e.g., spin-on deposition or lamination). The patterning of the photoresist 166 may expose areas around the openings 108. The photoresist 166 may be patterned using any suitable lithographic technique.

Figure 3E:
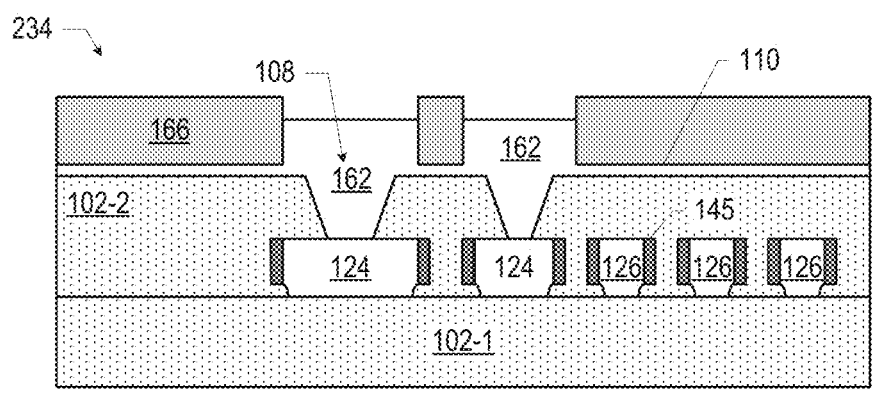

FIG. 3E illustrates an assembly 234 subsequent to depositing conductive material 162 (e.g., metal) in the openings 108 on the seed layer 110 of the assembly 232 (FIG. 3D). The conductive material 162 may be formed by electroplating on the seed layer 110. The top surface of the conductive material 162 may be recessed below the top surface of the photoresist 166, as shown in FIG. 3E, in some embodiments.

Figure 3F:
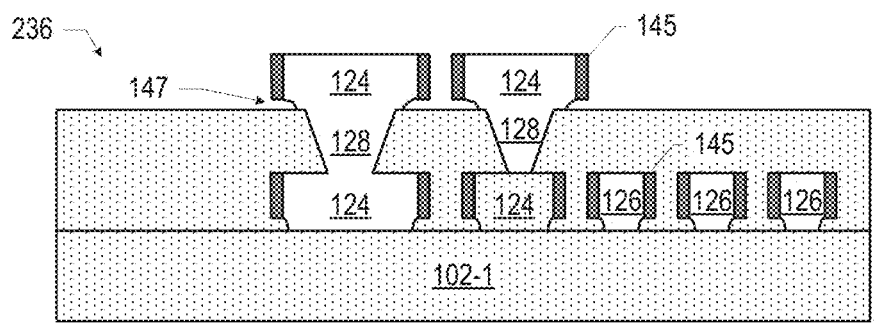

FIG. 3F illustrates an assembly 236 subsequent to performing the operations described above with reference to FIGS. 2D-2G on the assembly 234 (FIG. 3E) to form vias 128 and additional pads 124. A protective layer 145 may be disposed on side surfaces of the additional pads 124, and the additional pads 124 may be undercut, in accordance with any of the embodiments discussed above. The operations of FIGS. 3A-3F may be repeated as desired to form multiple layers of features in the IC package support 100. The resulting assembly may be further processed to form the conductive contacts 135, and any additional operations may also be performed.

In some embodiments, vias 128, lines 126, and pads 124 may be formed using self-aligned techniques. In some such embodiments, the width of a via 128 and an associated pad 124 (e.g., a line) on which it lands may be the same. FIGS. 4A-4C, 5A-5C, and 6A-6C illustrate stages in an example process of manufacturing an IC package support 100 using self-aligned techniques, in accordance with various embodiments. In particular, the "A" sub-figures represent top views of various assemblies, the "B" sub-figures represent cross-sectional side views through the B-B sections of the "A" sub-figures, and the "C" sub-figures represent cross-sectional side views through the C-C sections of the "A" sub-figures. The self-aligned structures that may be manufactured using the operations illustrated in FIGS. 4-6 may improve the reliability of stacked features (e.g., vias on lines) by reducing misalignment relative to "sequential" photoresist techniques (such as those illustrated in FIGS. 2B-2I), but may result in a decreased interconnect density relative to such techniques.

FIG. 4 illustrates the assembly 200 discussed above with reference to FIG. 2A, including a seed layer 120 on a dielectric material 102-1. An adhesion promoter material (not shown) may be disposed between the seed layer 120 and the dielectric material 102-1.

FIG. 5 illustrates an assembly 268 subsequent to depositing a photoresist 114 on the seed layer 120 of the assembly 200 (FIG. 4), patterning the photoresist 114, and forming a conductive material 170 on the seed layer 120 and in the openings of the patterned photoresist 114. These operations may take the form of any of the embodiments discussed above with reference to FIGS. 2B-2C, for example.

FIG. 6 illustrates an assembly 270 subsequent to depositing another photoresist 168 on the assembly 268 (FIG. 5), and patterning the photoresist 168. The photoresist 168 may be deposited before stripping the photoresist 114, as shown in FIG. 6. The patterned photoresist 168 may include openings to selectively expose some of the conductive material 170. Processing of the assembly 268 may continue by depositing additional conductive material (not shown) in the openings of the patterned photoresist 168, then stripping the photoresist 168 and the photoresist 114. The resulting structure may include both vias 128 (e.g., corresponding to the openings in the patterned photoresist 114) and pad/lines (e.g., corresponding to the openings in the patterned photoresist 168, or vice versa). The resulting structure may then be covered with a protective layer 145, this protective layer 145 may be directionally etched, and then a seed etch may be performed (e.g., as discussed above with reference to FIGS. 2E-2G). Operations like those discussed above with reference to FIGS. 4-6 may be performed instead of or in addition to sequential photoresist techniques like those discussed herein with reference to FIGS. 2B-2I.

The IC package supports 100 disclosed herein may be included in any suitable electronic component. FIGS. 7-11 illustrate various examples of apparatuses that may include any of the IC package supports 100 disclosed herein, or may be included in an IC package that also includes any of the IC package supports 100 disclosed herein.

Figure 7:
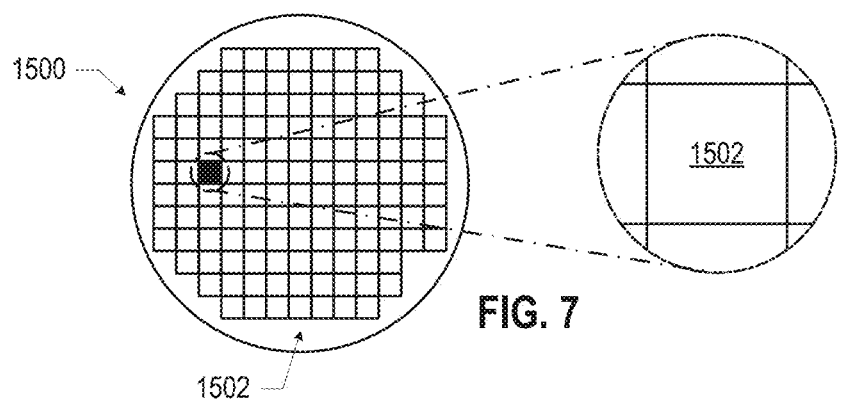
FIG. 7 is a top view of a wafer and dies that may be included in an IC package having an IC package support in accordance with any of the embodiments disclosed herein.

FIG. 7 is a top view of a wafer 1500 and dies 1502 that may be included in an IC package including one or more IC package supports 100 (e.g., as discussed below with reference to FIG. 9) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 8, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array.

Figure 8:
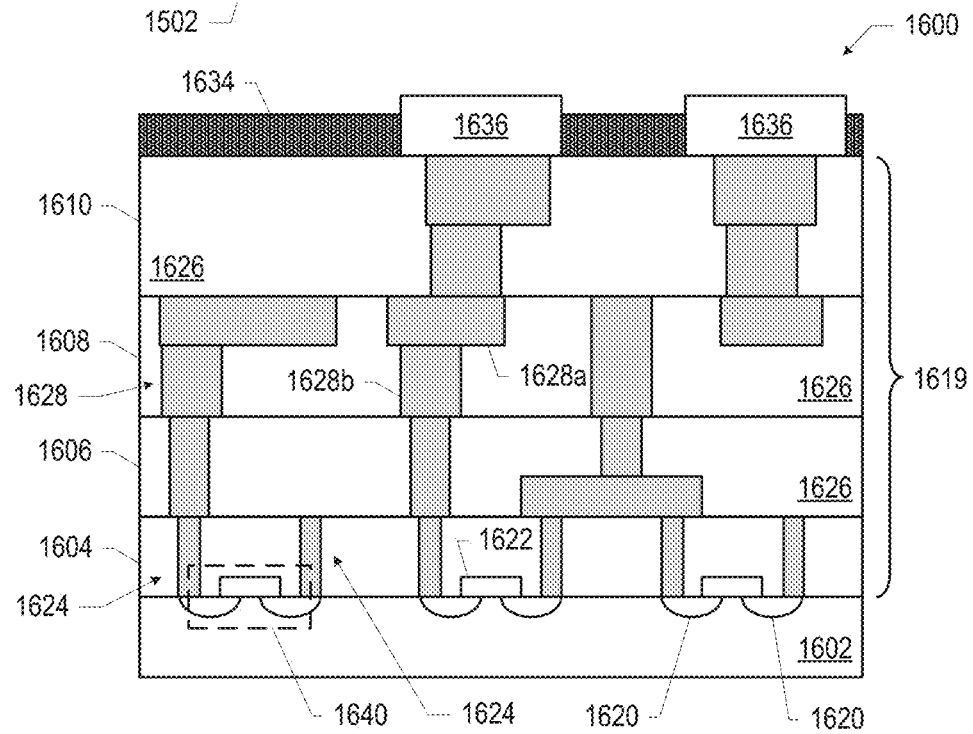
FIG. 8 is a cross-sectional side view of an IC device that may be included in an IC package having an IC package support in accordance with any of the embodiments disclosed herein.

FIG. 8 is a cross-sectional side view of an IC device 1600 that may be included in an IC package including one or more IC package supports 100 (e.g., as discussed below with reference to FIG. 9), in accordance with any of the embodiments disclosed herein. One or more of the IC devices 1600 may be included in one or more dies 1502 (FIG. 7). The IC device 1600 may be formed on a substrate 1602 (e.g., the wafer 1500 of FIG. 7) and may be included in a die (e.g., the die 1502 of FIG. 7). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 7) or a wafer (e.g., the wafer 1500 of FIG. 7).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 8 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two side surface portions that are substantially perpendicular to the top surface of the substrate. In other embodiments, at least one of the metal layers that form the gate electrode may simply be a planar layer that is substantially parallel to the top surface of the substrate and does not include side surface portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of side surface spacers may be formed on opposing sides of the gate stack to bracket the gate stack. The side surface spacers may be formed from materials such as silicon nitride, silicon oxide, silicon carbide, silicon nitride doped with carbon, and silicon oxynitride. Processes for forming side surface spacers are well known in the art and generally include deposition and etching process steps. In some embodiments, a plurality of spacer pairs may be used; for instance, two pairs, three pairs, or four pairs of side surface spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 8 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 8). Although a particular number of interconnect layers 1606-1610 is depicted in FIG. 8, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 8. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 8. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 8, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 9:
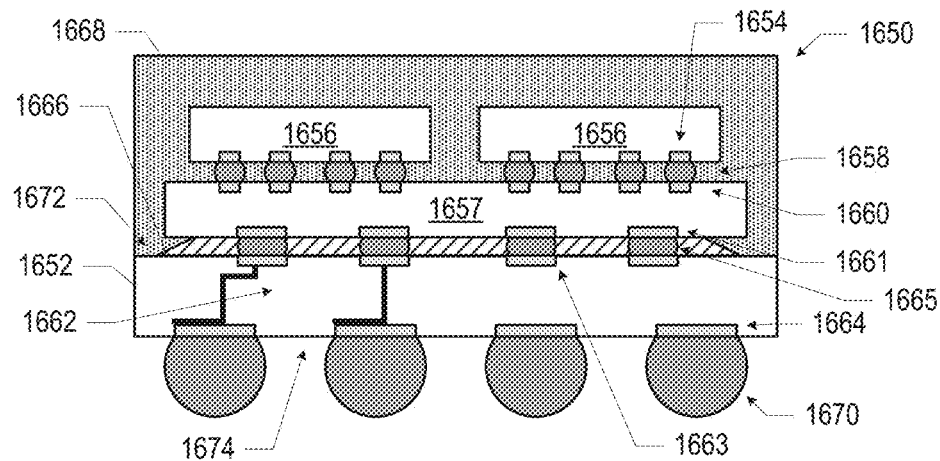
FIG. 9 is a cross-sectional side view of an IC package that may include any of the IC package supports disclosed herein.

FIG. 9 is a cross-sectional side view of an example IC package 1650 that may include one or more IC package support 100. For example, the package substrate 1652 and/or the interposer 1657 may be an IC package support 100, in accordance with any of the embodiments disclosed herein. In some embodiments, the IC package 1650 may be a system-in-package (SiP).

The package substrate 1652 may be formed of a dielectric material, and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 8. The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown). In embodiments in which the package substrate 1652 is an IC package support 100, the conductive contacts 1663 may be the conductive contacts 135, and the conductive contacts 1664 may be the conductive contacts 125.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 9 are solder bumps, but any suitable first-level interconnects 1665 may be used. In embodiments in which the interposer 1657 is an IC package support 100, the conductive contacts 1660 may be the conductive contacts 135, and the conductive contacts 1661 may be the conductive contacts 125. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 9 are solder bumps, but any suitable first-level interconnects 1658 may be used.

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 9 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 10.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, a single logic die 1656 may be electrically coupled to multiple memory dies 1656 through an IC package support 100 (e.g., the interposer 1657 or the package substrate 1652 when the interposer 1657 is not present); the logic die 1656 may communicate with the multiple memory dies 1656 through the fine line space portion 115 of the IC package support 100. The fine line space portion 115 may provide the interconnect density needed to support high bandwidth communications in such an embodiment. In other embodiments, multiple logic dies 1656 may communicate through the fine line space portion 115 of the IC package support 100.

Although the IC package 1650 illustrated in FIG. 9 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 9, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 10:
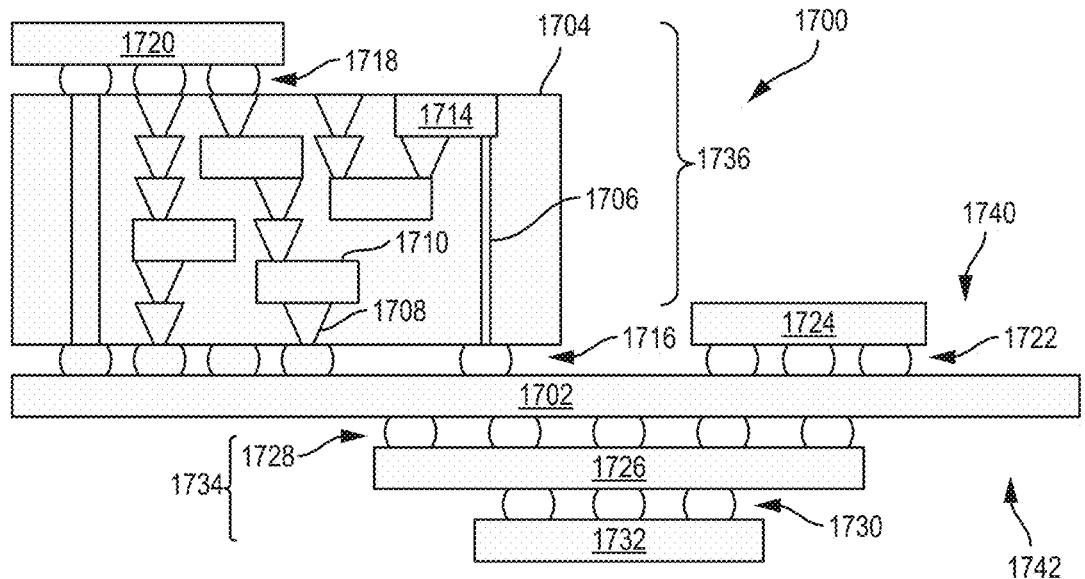
FIG. 10 is a cross-sectional side view of an IC device assembly that may include an IC package support in accordance with any of the embodiments disclosed herein.

FIG. 10 is a cross-sectional side view of an IC device assembly 1700 that may include one or more IC packages including one or more IC package supports 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 9 (e.g., may include one or more IC package supports 100 as a package substrate 1652 or an interposer 1657).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 7), an IC device (e.g., the IC device 1600 of FIG. 8), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
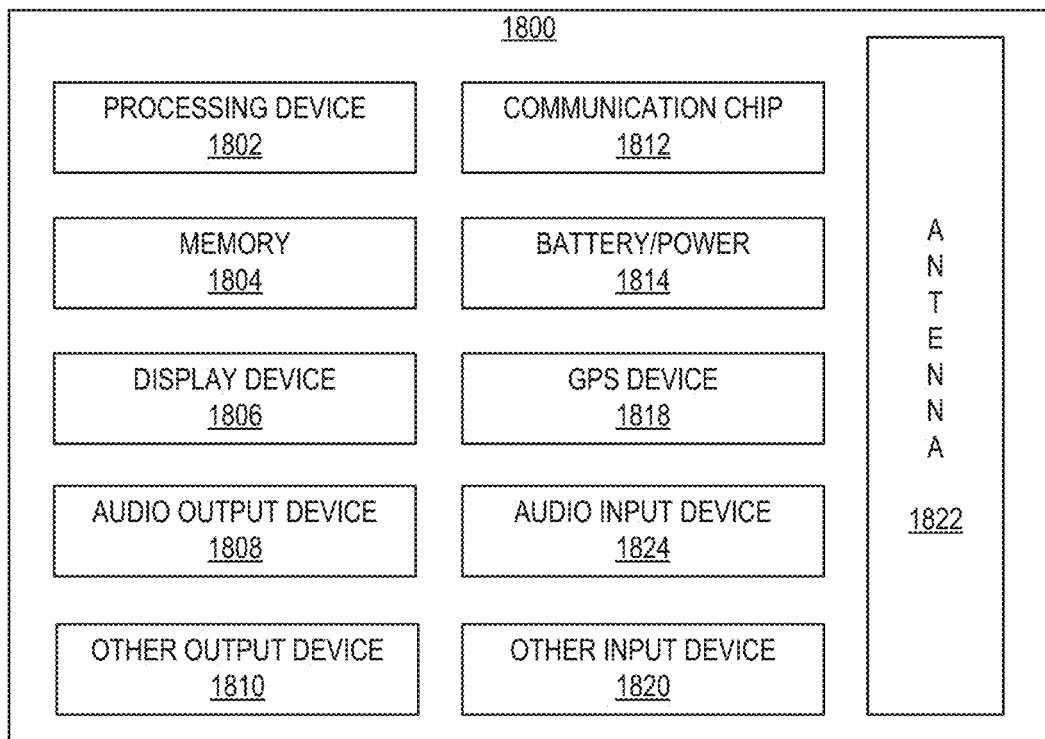
FIG. 11 is a block diagram of an example electrical device that may include an IC package support in accordance with any of the embodiments disclosed herein.

FIG. 11 is a block diagram of an example electrical device 1800 that may include one or more IC package supports 100 in accordance with any of the embodiments disclosed herein. For example, any suitable ones of the components of the electrical device 1800 may include one or more of the IC device assemblies 1700 or IC packages 1650 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a layer of dielectric material; a conductive pad at least partially on a top surface of the layer of dielectric material; and a layer of material on side surfaces of the conductive pad, wherein the layer of material does not extend onto the top surface of the layer of dielectric material.

Example 2 may include the subject matter of Example 1, and may further specify that the material includes nitrogen.

Example 3 may include the subject matter of any of Examples 1-2, and may further specify that the material includes a polymer.

Example 4 may include the subject matter of any of Examples 1-3, and may further specify that the material has a thickness on the side surfaces of the conductive pad between 200 nanometers and 400 nanometers.

Example 5 may include the subject matter of any of Examples 1-4, and may further specify that the conductive pad is undercut proximate to the top surface of the layer of dielectric material.

Example 6 may include the subject matter of Example 5, and may further specify that a height of the undercut is between 200 nanometers and 1 micron.

Example 7 may include the subject matter of any of Examples 1-6, and may further specify that the conductive pad includes copper.

Example 8 may include the subject matter of any of Examples 1-7, and may further specify that the dielectric material is an organic, polymer-based dielectric.

Example 9 may include the subject matter of any of Examples 1-8, and may further specify that the layer of material does not extend onto a top surface of the conductive pad.

Example 10 may include the subject matter of any of Examples 1-9, and may further include: a conductive via in conductive contact with a top surface of the conductive pad, wherein the layer of material is not present on side surfaces of the conductive via.

Example 11 may include the subject matter of Example 10, and may further specify that the layer of material is a first layer of nitride material, the IC package support further includes a second layer of nitride material on the first layer of nitride material on the side surfaces of the conductive pad, and the second layer of nitride material extends onto side surfaces of the conductive via.

Example 12 may include the subject matter of Example 11, and may further specify that the second layer of nitride material extends onto the top surface of the layer of dielectric material.

Example 13 may include the subject matter of any of Examples 10-12, and may further specify that the conductive via has a diameter that is less than 20 microns.

Example 14 may include the subject matter of any of Examples 10-12, and may further specify that the conductive via has a diameter between 20 microns and 50 microns.

Example 15 may include the subject matter of any of Examples 1-14, and may further specify that the IC package support is a package substrate.

Example 16 may include the subject matter of any of Examples 1-14, and may further specify that the IC package support is an interposer.

Example 17 is an integrated circuit (IC) package support, including: a conductive pad; and a conductive via in conductive contact with a top surface of the conductive pad; wherein the conductive pad has material including nitrogen on side surfaces of the conductive pad, the material on the side surfaces of the conductive pad has a first thickness on the side surfaces of the conductive pad, the conductive via has material including nitrogen on side surfaces of the conductive via, the material on the side surfaces of the conductive via has a second thickness on the side surfaces of the conductive pad, and the second thickness is less than the first thickness.

Example 18 may include the subject matter of Example 17, and may further specify that the material on the side surfaces of the conductive pad includes multiple layers of material having different material compositions.

Example 19 may include the subject matter of any of Examples 17-18, and may further specify that the material on the side surfaces of the conductive via includes a single layer of material.

Example 20 may include the subject matter of Example 19, and may further specify that the single layer of material on the side surfaces of the conductive via extends onto a dielectric material layer on which the conductive pad is at least partially disposed.

Example 21 may include the subject matter of any of Examples 17-20, and may further specify that the first thickness is greater than 400 nanometers.

Example 22 may include the subject matter of any of Examples 17-21, and may further specify that the conductive via tapered side surfaces with an angle that is less than 80 degrees.

Example 23 may include the subject matter of any of Examples 17-22, and may further specify that the conductive via has tapered side surfaces with an angle that is greater than 80 degrees.

Example 24 may include the subject matter of any of Examples 17-23, and may further specify that the IC package support is a package substrate.

Example 25 may include the subject matter of any of Examples 17-23, and may further specify that the IC package support is an interposer.

Example 26 is a computing device, including: an integrated circuit (IC) package including an IC package support, wherein the IC package support includes conductive lines and a protective layer on side surfaces of the conductive lines, wherein the protective layer has a thickness on the side surfaces of the conductive lines between 200 nanometers and 400 nanometers; and a circuit board coupled to the IC package.

Example 27 may include the subject matter of Example 26, and may further specify that the IC package includes one or more dies coupled to the IC package support.

Example 28 may include the subject matter of Example 27, and may further specify that the one or more dies include at least one logic die and at least one memory die.

Example 29 may include the subject matter of any of Examples 26-28, and may further specify that the IC package support is a package substrate.

Example 30 may include the subject matter of any of Examples 26-28, and may further specify that the IC package support is an interposer.

Example 31 may include the subject matter of any of Examples 26-30, and may further include: an antenna coupled to the circuit board.

Example 32 may include the subject matter of any of Examples 26-31, and may further specify that the computing device is a server device.

Example 33 may include the subject matter of any of Examples 26-31, and may further specify that the computing device is a handheld computing device.

Example 34 is a method of manufacturing an integrated circuit (IC) package support, including: forming a conductive seed layer; depositing and patterning a photoresist on the conductive seed layer; after depositing and patterning the photoresist, plating a conductive material on the conductive seed layer to form a conductive structure; after plating the conductive material, removing the photoresist; after removing the photoresist, forming a conformal protective layer on the conductive structure; directionally etching the protective layer so that the protective layer remains on side surfaces of the conductive structure; and after directionally etching the protective layer, etching the conductive structure to remove exposed portions of the conductive seed layer.

Example 35 may include the subject matter of Example 34, and may further specify that the conductive seed layer includes copper.

Example 36 may include the subject matter of any of Examples 34-35, and may further specify that the conductive seed layer has a thickness between 200 nanometers and 1 micron.

Example 37 may include the subject matter of any of Examples 34-36, and may further specify that the protective layer includes nitrogen.

Example 38 may include the subject matter of any of Examples 34-37, and may further specify that the protective layer includes silicon and nitrogen.

Example 39 may include the subject matter of any of Examples 34-38, and may further specify that the protective layer has a thickness between 200 nanometers and 400 nanometers.

Example 40 may include the subject matter of any of Examples 34-39, and may further specify that the protective layer is formed by chemical vapor deposition.

Example 41 may include the subject matter of any of Examples 34-40, and may further specify that the conductive seed layer is at least partially formed on a dielectric material, and the dielectric material includes an organic, polymer-based dielectric or a photoimageable dielectric.

Example 42 may include the subject matter of any of Examples 34-41, and may further include: after etching the conductive structure, forming a dielectric material over the etched conductive structure.

Example 43 may include the subject matter of Example 42, and may further specify that no roughening operation is performed between etching the conductive structure and forming the dielectric material.

Example 44 may include the subject matter of any of Examples 42-43, and may further include: drilling an opening through the dielectric material to expose a portion of the etched conductive structure.

Example 45 is an integrated circuit (IC) package support, including: a layer of dielectric material; a conductive pad at least partially on a top surface of the layer of dielectric material; and a layer of material on side surfaces of the conductive pad, wherein the layer of material does not extend onto the top surface of the conductive pad.

Example 46 may include the subject matter of Example 45, and may further specify that the material includes nitrogen.

Example 47 may include the subject matter of any of Examples 45-46, and may further specify that the material includes a polymer.

Example 48 may include the subject matter of any of Examples 45-47, and may further specify that the material has a thickness on the side surfaces of the conductive pad between 200 nanometers and 400 nanometers.

Example 49 may include the subject matter of any of Examples 45-48, and may further specify that the conductive pad is undercut proximate to the top surface of the layer of dielectric material.

Example 50 may include the subject matter of Example 49, and may further specify that a height of the undercut is between 200 nanometers and 1 micron.

Example 51 may include the subject matter of any of Examples 45-50, and may further specify that the conductive pad includes copper.

Example 52 may include the subject matter of any of Examples 45-51, and may further specify that the dielectric material is an organic, polymer-based dielectric.

Example 53 may include the subject matter of any of Examples 45-52, and may further include: a conductive via in conductive contact with a top surface of the conductive pad, wherein the layer of material is not present on side surfaces of the conductive via.

Example 54 may include the subject matter of Example 53, and may further specify that the layer of material is a first layer of nitride material, the IC package support further includes a second layer of nitride material on the first layer of nitride material on the side surfaces of the conductive pad, and the second layer of nitride material extends onto side surfaces of the conductive via.

Example 55 may include the subject matter of Example 54, and may further specify that the second layer of nitride material extends onto the top surface of the layer of dielectric material.

Example 56 may include the subject matter of any of Examples 53-55, and may further specify that the conductive via has tapered side surfaces with an angle that is less than 80 degrees.

Example 57 may include the subject matter of any of Examples 53-55, and may further specify that the conductive via has tapered side surfaces with an angle that is greater than 80 degrees.

Example 58 may include the subject matter of any of Examples 45-57, and may further specify that the IC package support is a package substrate.

Example 59 may include the subject matter of any of Examples 45-57, and may further specify that the IC package support is an interposer.

The invention claimed is:

1. An integrated circuit (IC) package support, comprising:
   a layer of dielectric material;
   a conductive pad at least partially on a top surface of the layer of dielectric material, wherein the conductive pad is undercut proximate to the top surface of the layer of dielectric material, and wherein a depth or width of a portion of conductive pad with the undercut is less than a depth or width of a portion of the conductive pad without the undercut; and
   a layer of material on side surfaces of the conductive pad, wherein the layer of material does not extend onto the top surface of the layer of dielectric material, does not extend onto a bottom surface of the conductive pad, and does not extend onto the undercut proximate to the top surface of the layer of dielectric material, and wherein the material has a thickness on the side surfaces of the conductive pad between 200 nanometers and 400 nanometers; and
   a conductive via in conductive contact with a top surface of the conductive pad, wherein the layer of material is not present on side surfaces of the conductive via.

2. The IC package support of claim 1, wherein the material includes nitrogen or a polymer.

3. The IC package support of claim 1, wherein the conductive pad includes copper.

4. The IC package support of claim 1, wherein the layer of material does not extend onto a top surface of the conductive pad.

5. The IC package support of claim 1, wherein the layer of material is a first layer of nitride material, the IC package support further includes a second layer of nitride material on the first layer of nitride material on the side surfaces of the conductive pad, and the second layer of nitride material extends onto side surfaces of the conductive via.

6. The IC package support of claim 1, wherein the IC package support is a package substrate or an interposer.

7. The IC package support of claim 5, wherein the second layer of nitride material extends onto the top surface of the layer of dielectric material.

8. A computing device, comprising:
   an integrated circuit (IC) package including an IC package support, wherein the IC package support includes a layer of dielectric material and a conductive line at least partially on a top surface of the layer of dielectric material, wherein the conductive line is undercut proximate to a bottom surface of the conductive line, and wherein a depth or width of a portion of the conductive line with the undercut is less than a depth or width of a portion of the conductive line without the undercut, and a protective layer on side surfaces of the conductive line, wherein the protective layer has a thickness on the side surfaces of the conductive line between 200 nanometers and 400 nanometers, wherein the protective layer does not extend onto the undercut, and wherein the protective layer does not extend onto top surfaces and bottom surfaces of the conductive line; and
   a circuit board coupled to the IC package.

9. The computing device of claim 8, wherein the IC package includes one or more dies coupled to the IC package support.

10. The computing device of claim 8, further comprising:
    an antenna coupled to the circuit board.

11. The computing device of claim 8, wherein the computing device is a server device or a handheld computing device.

12. An integrated circuit (IC) package support, comprising:
    a layer of dielectric material;
    a conductive pad at least partially on a top surface of the layer of dielectric material, wherein the conductive pad is undercut proximate to the top surface of the layer of dielectric material, and wherein a depth or width of a portion of conductive pad with the undercut is less than a depth or width of a portion of the conductive pad without the undercut; and
    a layer of material on side surfaces of the conductive pad, wherein the layer of material does not extend onto a top surface and a bottom surface of the conductive pad, and does not extend onto the undercut proximate to the top surface of the layer of dielectric material, and wherein the material has a thickness on the side surfaces of the conductive pad between 200 nanometers and 400 nanometers; and
    a conductive via in conductive contact with the top surface of the conductive pad, wherein the layer of material is not present on side surfaces of the conductive via.

13. The IC package support of claim 12, wherein the conductive via has tapered side surfaces with an angle that is less than 80 degrees.

14. The IC package support of claim 12, wherein the conductive via has tapered side surfaces with an angle that is greater than 80 degrees.

15. The IC package support of claim 12, wherein the IC package support is a package substrate.

16. The IC package support of claim 12, wherein the IC package support is an interposer.

* * * * *